US012722810B1

(12) United States Patent
Allison

(10) Patent No.: US 12,722,810 B1
(45) Date of Patent: Sep. 1, 2026

(54) MAGNETICALLY COUPLED CONDUCTIVE THERMAL INTERFACE

(71) Applicant: Government of the United States as represented by the Secretary of the Air Force, Kirtland AFB, NM (US)

(72) Inventor: Jonathan Allison, Albuquerque, NM (US)

(73) Assignee: United States of America as represented by the Secretary of the Air Force, Kirtland AFB, NM (US)

( * ) Notice: Subject to any disclaimer, the term of this patent is extended or adjusted under 35 U.S.C. 154(b) by 242 days.

(21) Appl. No.: 18/759,987

(22) Filed: Jun. 30, 2024

(51) Int. Cl.
*B64G 1/64* (2006.01)
*B64G 1/50* (2006.01)
*H05K 7/20* (2006.01)

(52) U.S. Cl.
CPC ........... *B64G 1/6462* (2023.08); *B64G 1/506* (2013.01); *H05K 7/20254* (2013.01); *H05K 7/20272* (2013.01); *H05K 7/20281* (2013.01)

(58) Field of Classification Search
CPC .. B64G 1/6462; B64G 1/506; H05K 7/20254; H05K 7/20272; H05K 7/20281
See application file for complete search history.

(56) References Cited

U.S. PATENT DOCUMENTS 6,275,751 B1 * 8/2001 Stallard ................ B64G 1/6462 701/1
7,815,149 B1 10/2010 Howard et al.
8,820,864 B2 9/2014 McKinnon et al.
10,984,936 B2 4/2021 Jochum
2006/0033205 A1 * 2/2006 Sauciuc ................ H10W 40/70 257/E23.098
2022/0084729 A1 3/2022 Arshavskiy

OTHER PUBLICATIONS

Ku, Jentung, Introduction to Heat Pipes, Thermal and Fluid Analysis Workshop, Aug. 3-7, 2015,Goddard Space Flight Center,Silver Spring MD, USA.
Joshua Smith et al., Battery thermal management system for electric vehicle using heat pipes, International Journal of Thermal Sciences, Aug. 29, 2018, pp. 517-529, vol. 134, Elsevier Masson SAS, France.
Francesco Branz et al., Miniature docking mechanism for CubeSats, Acta Astronautica, Jul. 2, 2020, pp. 510-519, vol. 176, Elsevier Science Ltd., London UK.

* cited by examiner

*Primary Examiner* — Mohamad A Musleh
(74) *Attorney, Agent, or Firm* — AFNWC/JA; David L. Narciso

(57) ABSTRACT

A Magnetically Coupled Conductive Thermal Interface (MCCTI) for transferring heat from a client to a servicer, the MCCTI providing a thermal interface using an array of electropermanent magnets (EPMs) interfacing with a ferrous target (FT) to create sufficient interfacial pressure to provide a low interfacial thermal resistance that permits heat transfer across the interface without using fasteners such as bolts, adhesives, and the like. Various embodiments use separate heat pipes mounted on each side of the interface which permit spacecraft on both sides of the interface to efficiently transport heat therebetween via the interface.

22 Claims, 2 Drawing Sheets

MAGNETICALLY COUPLED CONDUCTIVE THERMAL INTERFACE

GOVERNMENT INTEREST

The invention described herein may be manufactured and used by or for the Government of the United States for all governmental purposes without the payment of any royalty.

FIELD OF THE DISCLOSURE

The present invention relates generally to heat transport between separable/rejoinable spacecraft through docking interfaces.

BACKGROUND

This section is intended to introduce the reader to various aspects of art, which may be related to various aspects of the present invention that are described and/or claimed below. This discussion is believed to be helpful in providing the reader with background information to facilitate a better understanding of the various aspects of the present invention. Accordingly, it should be understood that these statements are to be read in this light, and not as admissions of prior art.

Spacecraft docking interfaces deliver services between spacecraft such as propellants, power, information, and thermal control. Individual spacecraft thermal control systems (TCS) enable heat transfer between portions of components of the spacecraft to maintain appropriate temperatures, including absorbing heat and radiating heat to space as needed. Spacecraft TCS can use many heat transport technologies, some using fluid including pumped fluid loops (PFLs) and various heat pipe (HP) types suitable for use in space, such as constant conductance heat pipes (CCHPs), variable conductance heat pipes (VCHPs), and oscillating heat pipes (OHPs); and some using conductive heat transfer, such as through structural elements or conductive heat straps. Separable/rejoinable spacecraft currently use a separable/rejoinable thermal control interface providing thermal control or heat transport between spacecraft. While many heat transport technologies are capable of being manufactured and installed in a satellite factory for use within a spacecraft, a separable/rejoinable thermal control interface is more complex as it must be "connected" in space to enable heat transfer across the interface to meet the TCS needs of each spacecraft when joined. The only means known today for transferring heat across a separable/rejoinable spacecraft interface requires the use of pumped fluid loops (PFLs) .PFLs are known for their great size, weight, power, cost, unreliability, and slow acquisition time. Further, using PFLs within the context of separable/rejoinable spacecraft thermal interfaces requires self-sealing quick disconnects (QDs) to provide a thermal interface that is self-sealing and has low loss interconnects enabling coolant fluid flow between the separable/rejoinable spacecraft. Such self-sealing QDs for use with PFLs in separable/rejoinable spacecraft are more complicated, with increases in size, mass, and cost, compared to conventional QDs, are prone to unreliability, and have high hydraulic resistance resulting in increased pumping power requirements to drive flow through them. The most common cause of failure of PFLs is debris clogging the system, and the most common cause of debris is corrosion products, such as resulting from the combinations of materials used in the PFLs and QDs in contact with the coolant fluid over time.

Due to the issues that arise from using PFLs and associated QDs to enable heat transfer between separable/rejoinable spacecraft, an improved thermal interface for separable/rejoinable spacecraft is desired.

SUMMARY OF THE INVENTION

Various deficiencies in existing separable/rejoinable thermal interface systems discussed above are addressed below by the disclosed Magnetically Coupled Conductive Thermal Interface (MCCTI) suitable for use as a separable/rejoinable thermal interface (or portion thereof) of a spacecraft docking interface and configured to provide heat transfer from a client to a servicer without requiring use of a coolant fluid across the docking interface. Heat transport technologies or mechanisms providing heat transfer to and from the docking interface within each spacecraft may comprise actively pumped fluid systems (PFLs) and passively pumped fluid systems, such as various types of heat pipes, and solid conduction technologies like conductive thermal straps, thermal conduction through structural materials, and so on.

A MCCTI according to various embodiments provides a thermal interface configured to provide good thermal performance at a reasonable mass by using an array of electropermanent magnet (EPM) interfacing with a ferrous target (FT) to create sufficient interfacial pressure to create a low interfacial thermal resistance that enables conductive heat transfer across the interface without using fasteners such as bolts, adhesives, and the like. Various embodiments use heat transport technologies such as separate heat pipes mounted on each side of the interface which permit spacecraft on both sides of the interface to efficiently transport heat therebetween via the interface.

An apparatus according to an embodiment to transport heat between separable/rejoinable spacecraft from a client to a servicer when docked may comprise a Magnetically Coupled Conductive Thermal Interface (MCCTI) for transferring heat from a client to a servicer, the MCCTI comprising: a client portion configured to couple heat from a client thermal control system (TCS) toward a client thermal interface, and a first portion of an electromagnetic coupling mechanism configured to urge the client thermal interface toward a corresponding servicer thermal interface when activated; a servicer portion configured to couple heat from a servicer thermal interface toward a servicer TCS, and a second portion of the electromagnetic coupling mechanism configured to urge the servicer thermal interface toward a corresponding client thermal interface when activated; the first and second portions of the electromagnetic coupling mechanism being positioned to magnetically cooperate with each other; wherein the electromagnetic coupling mechanism comprises a ferrous target (FT) portion and an electropermanent magnet (EPM) portion.

A MCCTI according to an embodiment may comprise a client portion comprising a heat transport technology, such as one or more constant conductance heat pipes (CCHPs), configured to couple heat from a client thermal control system (TCS) toward a client thermal interface, and a first portion of an electromagnetic coupling mechanism configured to urge the client thermal interface toward a corresponding servicer thermal interface when activated; a servicer portion comprising a heat transport technology, such as one or more constant conductance heat pipes (CCHPs) configured to couple heat from a servicer thermal interface toward a servicer TCS, and a second portion of the electromagnetic coupling mechanism configured to urge the servicer thermal interface toward a corresponding client thermal interface when activated; the first and second portions of the electromagnetic coupling mechanism being positioned to magnetically cooperate with each other; wherein at least one of the client thermal interface and servicer thermal interface has disposed thereon a thermal interface material (TIM) configured to enable heat transfer between the client thermal interface and servicer thermal interface; wherein the electromagnetic coupling mechanism comprises a ferrous target (FT) portion and an electropermanent magnet (EPM) portion.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments of the present invention given below, serve to explain the principles of the present invention.

Figure 1:
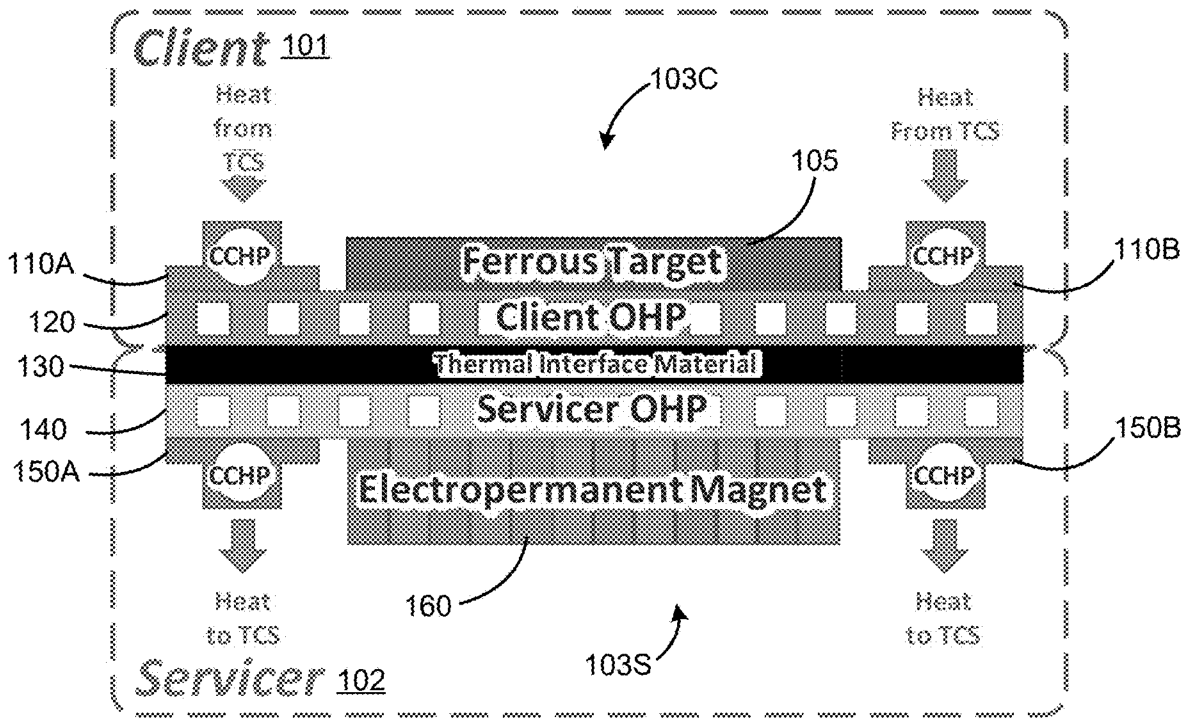
FIG. 1 depicts a block diagram of a serial Magnetically Coupled Conductive Thermal Interface (MCCTI) according to an embodiment.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

The following description and drawings merely illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be only for illustrative purposes to aid the reader in understanding the principles of the invention and the concepts contributed by the inventor(s) to furthering the art and are to be construed as being without limitation to such specifically recited examples and conditions. Additionally, the term, "or" as used herein, refers to a non-exclusive or, unless otherwise indicated (e.g., "or else" or "or in the alternative"). Also, the various embodiments described herein are not necessarily mutually exclusive, as some embodiments can be combined with one or more other embodiments to form new embodiments.

The numerous innovative teachings of the present application will be described with particular reference to the presently preferred exemplary embodiments. However, it should be understood that this class of embodiments provides only a few examples of the many advantageous uses of the innovative teachings herein. In general, statements made in the specification of the present application do not necessarily limit any of the various claimed inventions. Moreover, some statements may apply to some inventive features but not to others. Those skilled in the art and informed by the teachings herein will realize that the invention is also applicable to various other technical areas or embodiments.

Before the present invention is described in further detail, it is to be understood that the invention is not limited to the particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limit of that range and any other stated or intervening value in that stated range is encompassed within the invention. The upper and lower limits of these smaller ranges may independently be included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, a limited number of the exemplary methods and materials are described herein. It must be noted that as used herein and in the appended claims, the singular forms "a", "an", and "the" include plural referents unless the context clearly dictates otherwise.

The various embodiments will be discussed within the context of a Magnetically Coupled Conductive Thermal Interface (MCCTI) comprising a separable/rejoinable thermal interface (or portion thereof) of a separable/rejoinable spacecraft docking interface. The MCCTI is configured to enable heat transfer between client and servicer spacecraft without the use of coolants. Heat transport technologies or mechanisms providing such heat transfer may comprise actively pumped fluid systems (PFLs) and passively pumped fluid systems, such as various types of heat pipes including solid conduction technologies like conductive thermal straps and even just thermal conduction through structural materials.

Specifically, while the MCCTI is applicable for use in many applications, it finds immediate utility within the context of separable/rejoinable interfaces such as used, for example, by spacecraft and spacecraft mission architectures that require the ability to transfer heat (i.e. provide thermal control) across a docked interface (i.e., an interface that can be made/broken in space) and preferably without pumping a coolant fluid. Such spacecraft include proposed 'orbital testbeds' in which a host spacecraft provides services such as communication, power, and thermal regulation to a visiting experiment. This avoids the need for experiments to provide their own services, thereby saving on experiment costs. The costs of these services is amortized over the cost of the orbital testbed. Another type of spacecraft that can benefit from MCCTI are spacecraft that are assembled on-orbit, or whose connective topology may be rearranged in-orbit. MCCTI allows heat to be simply and easily transferred amongst the various components of such on-orbit assembled spacecraft.

A MCCTI according to an embodiment may comprise a client portion comprising at least two constant conductance heat pipes (CCHPs) configured to couple heat from a client thermal control system (TCS) toward a client thermal interface, and a first portion of an electromagnetic coupling mechanism configured to urge the client thermal interface toward a corresponding servicer thermal interface when activated; a servicer portion comprising at least two constant conductance heat pipes (CCHPs) configured to couple heat from a servicer thermal interface toward a servicer TCS, and a second portion of the electromagnetic coupling mechanism configured to urge the servicer thermal interface toward a corresponding client thermal interface when activated; the first and second portions of the electromagnetic coupling mechanism being positioned to magnetically cooperate with each other; wherein at least one of the client thermal interface and servicer thermal interface has disposed thereon a thermal interface material (TIM) configured to enable heat transfer between the client thermal interface and servicer thermal interface; wherein the electromagnetic coupling mechanism comprises a ferrous target (FT) portion and an electropermanent magnet (EPM) portion.

A MCCTI according to various embodiments provides a thermal interface configured to provide good thermal performance at a reasonable mass by using an array of electropermanent magnet (EPM) interfacing with a ferrous target (FT) to create sufficient interfacial pressure to create a low interfacial thermal resistance that permits heat transfer across the interface without using fasteners such as bolts, adhesives, and the like. Various embodiments use separate heat pipes mounted on each side of the interface which permit spacecraft on both sides of the interface to efficiently transport heat therebetween via the interface. In some embodiments, the separate heat pipes may be replaced by or augmented with one or more pumped fluid loops (PFLs).

In a serial MCCTI embodiment, a heat flow path is provided via compressing or squeezing together heat flow path components (e.g. client heat pipes, thermal interface material (TIM), servicer heat pipes, and the like). That is, a pressure generated heat flow path or component portion thereof comprises a sequence of heat flow path components compressed together to enable heat flow therethrough.

In a parallel MCCTI embodiment, an EPM-FT pair provides a pressure-generation path located structurally in parallel with a heat flow path (e.g. client heat pipes to thermal interface material (TIM) to servicer heat pipes).

Additional embodiments may provide a heat flow path formed of multiple heat flow path segments, wherein the heat flow path segments may be formed using either or both of parallel MCCTI and serial MCCTI arrangements.

Serial MCCTI (PMCCTI)

FIG. 1 depicts a block diagram of a serial Magnetically Coupled Conductive Thermal Interface (MCCTI) according to an embodiment. As depicted in FIG. 1, a serial MCCTI (SMCCTI) is configured to transfer heat from a thermal control system (TCS) of a client spacecraft or client experiment ("client") 101 to a TCS of a servicer spacecraft or other servicer device ("servicer") 102. The serial MCCTI includes client portion components and servicer portion components; namely, components associated with each of the client 101 (i.e., client components 103C) and servicer 102 (i.e., servicer components 103S).

Referring to FIG. 1, the MCCTI client components 103C comprise one or more (illustratively two) heat pipes 110A, 110B (illustratively Constant Conductance Heat Pipes (CCHP)) configured to convey heat from a client TCS (not shown) toward a plurality of client heat pipes (illustratively Oscillating Heat Pipes (illustratively OHPs)) 120. The MCCTI client components 103C further comprise a ferrous target (FT) 105 positioned to urge at least the client heat pipes 120 toward the MCCTI servicer components 103S in response to magnetic coupling signal received therefrom.

Referring to FIG. 1, the MCCTI service components 103S comprise a thermal interface material (TIM) 130 configured to mechanically receive a terminating portion of the client heat pipes 120 and convey heat therefrom 120 toward a plurality of servicer heat pipes (illustratively OHPs) 140. The servicer heat pipes 140 are configured to transfer heat toward one or more heat pipes 150A, 150B (illustratively two CCHPs) which are configured to transfer heat to a TCS (not shown) of the servicer 102. The MCCTI servicer components 103S further comprise an electropermanent magnet (EPM) 160 positioned to urge the FT 105 theretowards in response to an activation or docking signal.

It is noted that the positions of the EPM 160 and the FT 105 may be switched, such that the EPM 160 is part of the MCCTI client components 103C, and the FT 105 is part of the MCCTI service components 103S. As shown in FIG. 1 and described herein, the EPM 160 and the FT 105 together comprise an electromagnetic coupling mechanism configured to, when activated, controllably urge toward each other the client portion 103C (including the client thermal interface/path components) and servicer portion 103S (including the servicer thermal interface/path components) of the MCCTI.

The serial MCCTI (SMCCTI) 103 of FIG. 1 contemplates high conductance heat transfer paths be created from the client 101 to the servicer 102 while working between the tight space between the EPM 160 (nominally on the servicer side) and the FT 105 (nominally on the client side). Magnetic forces decay at an inverse square law which means that they have very little effect beyond a short distance away; another way to state this is that much larger EPMs and FTs are required as the EPM-FT distance increases, if the same mounting pressure is required. Thus, the SMCCTI uses relatively thin means for transferring heat from the EPM-FT footprint laterally to where thicker heat pipes (or other heat transport technology, including PFLs, simple solid conduction through structural materials or thermal straps, and so on) can transport the heat to the rest of the servicer and the client. These thicker heat pipes of the SMCCTI and may also be used to provide a constant or minimum amount of heat flow.

Referring to FIG. 1, the SMCCTI provides heat paths between client 101 and servicer 102 that are generally located within outer or peripheral (non-central) regions of the SMCCTI and provides an electromagnetic coupling mechanism that is generally located within an inner or central region of the SMCCTI.

The SMCCTI of FIG. 1 is depicted as using Oscillating Heat Pipes (OHPs) due to their thin form factors; however, it is noted that other types of heat pipes may also be used in the various embodiments.

The SMCCTI of FIG. 1 is depicted as using a thermal interface material (TIM) 130 cooperating with the servicer heat pipes 140 to facilitate the transfer of heat therebetween; however, it is noted that TIM may be used on either or both of the SMCCTI client components 103C and SMCCTI service components 103S. Nominally, the TIM may be mounted on the servicer spacecraft to minimize effort for the client. There are many spacecraft TIMs available, many of which may be suitable here. It should be noted that since TIMs are one of the leading sources of outgassing from new spacecraft, the presence of a volatile-bearing TIM on the outside of the spacecraft would be a serious contamination risk requiring careful contamination control and outgassing procedures. Fortunately, carbon-based TIMs such as GraFoil® and eGraf® (from NeoGraf Solutions, LLC of Lakewood, OH) and the like do not have such volatiles, provide good thermal performance (i.e., a high interfacial heat transfer coefficient) in high pressure applications, and are suited for this application. Also, carbon-based TIMs sometimes require high interfacial pressures, but these pressures can be produced by the EPM-FT pair as described in the prior art and advertising of the owner of the prior art. Another issue to be considered is whether the TIM can survive direct exposure to the space radiation environment. Carbon-based TIMs are robust and unlikely to have any problems but a swinging radiation shield can be included if necessary. The shield covers the TIM when undocked and slides out of way prior to docking. A TIM may be attached adhesively to the spacecraft to which it is mounted, or (preferably) the TIM may be held captive by bolting a frame around it to hold it to the designated spacecraft.

The above-described embodiments of a SMCCTI advantageously provide the following: (1) direct mechanical contact of EPM-ferrous target mechanical path gives a strong structural (as well as thermal) connection; (2) has no issues with tolerance stackups due to a low component count and reliable mechanical design; and (3) a compact docking area, which may potentially be a valuable real estate resource. It is noted that the SMCCTI has several disadvantages, such as: (1) two OHPs are required to be thermally in series which reduces the thermal performance somewhat relative to the alternative parallel MCCTI (PMCCTI); and (2) the increased distance between the EPM and FT will require larger/heavier EPM and FT than a PMCCTI of similar thermal performance.

Parallel MCCTI (PMCCTI)

Figure 2:
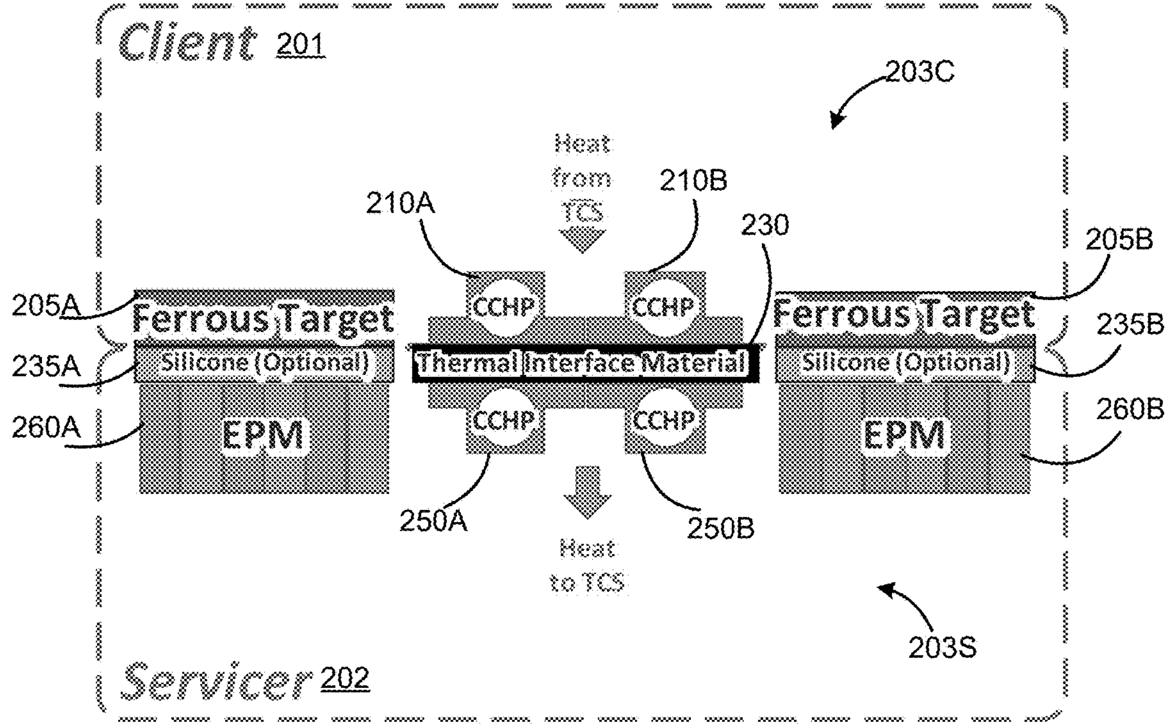
FIG. 2 depicts a block diagram of a parallel MCCTI according to an embodiment.

FIG. 2 depicts a block diagram of a parallel Magnetically Coupled Conductive Thermal Interface (PMCCTI) according to an embodiment. As depicted in FIG. 2, a parallel MCCTI (PMCCTI) is configured to transfer heat from a thermal control system (TCS) of a client spacecraft or client experiment ("client") 201 to a TCS of a servicer spacecraft or other servicer device ("servicer") 202. The parallel MCCTI includes components associated with each of the client 201 (i.e., client components 203C) and servicer 202 (i.e., servicer components 203S).

Referring to FIG. 2, the PMCCTI client components 203C comprise one or more (illustratively two) heat pipes 210A, 210B (illustratively Constant Conductance Heat Pipes (CCHP)) configured to convey heat from a client TCS (not shown) toward a thermal interface material (TIM) 230, such as may be provided at either or both of the client components 203C and servicer 202 at a mechanical interface therebetween. The PMCCTI client components 203C further comprise at least first 205A and second 205B ferrous targets (FTs) disposed on either side of the thermal path components 210/230 and positioned to urge the thermal path components 210/230 toward the PMCCTI servicer components 203S in response to magnetic coupling signal received therefrom.

Referring to FIG. 2, the MCCTI servicer components 203S comprise a thermal interface material (TIM) 230 configured to mechanically receive a terminating portion of the client heat pipes 210A, 210B and convey heat therefrom toward one or more heat pipes 250A, 250B (illustratively two CCHPs) which are configured to transfer heat to a TCS (not shown) of the servicer 202. The PMCCTI servicer components 203S further comprise at least first 260A and second 260B EPMs positioned to urge corresponding first 205A and second 205B FTs theretowards in response to an activation or docking signal.

Referring to FIG. 2, the PMCCTI provides heat paths between client 201 and servicer 202 that are generally located within an inner or central region of the SMCCTI and electromagnetic coupling mechanisms that are generally located within outer or peripheral (non-central) regions of the PSMCCTI.

The PMCCTI has many similarities to the SMCCTI, including the use of the TIM, the mounting pressure, and so on; however, one difference is that the thermal path is mounted adjacent, and in parallel with, the magnetic coupling means (e.g., an EPM-FT pair). The geometry can have the thermal path and the pressure generating path in any geometry relative to one another, but it is anticipated that the best embodiment is to place the pressure-generating path around the sides of the thermal path.

In PMCCTI, optionally there can be direct contact from the heat pipes (or PFLs) of one spacecraft to the other. This enables better thermal performance than SMCCTI. As with the SMCCTI, these heat pipes may also be used to provide a constant or minimum amount of heat flow.

Also, the EPM-FT are nearer one another, providing better contact pressure for less mass. However, this creates a situation in which the tolerance stackup of the thermal path and the pressure generating path must be considered. The risk is that if the pressure generating path stands proud that the thermal path will not contact or have insufficient contact pressure and thus insufficient thermal performance. On the other hand, if the thermal path stands proud then the pressure generating path may not get close enough and thus not generate enough pressure and thus also yielding insufficient thermal performance. As a result, PMCCTI requires more careful design of tolerances in the entire stackup in order to yield the intended performance. Note that an optimally functioning PMCCTI is unlikely to have direct contact between the EPM and FT, so as to insure that direct contact does occur at the thermal interface.

If direct contact between the EPM and FT is desired, an optional layer of a radiation hardened and mechanically compliant material may be provided therebetween on either or both of the client 210 side or servicer 202 side used, such as thin silicone layers 235A, 235B as depicted. Materials other than silicone may also be used for this purpose of permitting contact and a small amount of interfacial pressure at the EPM-FT interface while the majority of pressure occurs at the thermal path interface components.

In various embodiments, regulation of the flow of heat across the MCCTI is provided by using variable conductance heat pipes (VCHPs) rather than constant conductance heat pipes (CCHPs). Specifically, some or all of the CCHPs may be replaced by variable conductance heat paths such as via VCHPs, LHPs (loop heat pipes), CPLs (capillary pumped loops), and/or other means of providing a variably heat conductance function. In some embodiments, a minimum or constant amount of heat flow is supported via CCHPs while an additional amount of heat flow is controllably provided via VCHPs or similar means.

In various embodiments, reusable TIMs and the use of EPMs enables repeated MCCTI attaching and detaching without damage to the MCCTI. The TIM material may comprise any thermal interface or thermal transfer material providing sufficient thermal transfer efficiency between the client and servicer interface portions as described herein within a space or other environment, and may be affixed using adhesives or mechanical trapping, compression, or other means. TIMS may be on either or both of the client and servicer side of the interface.

Figure 3:
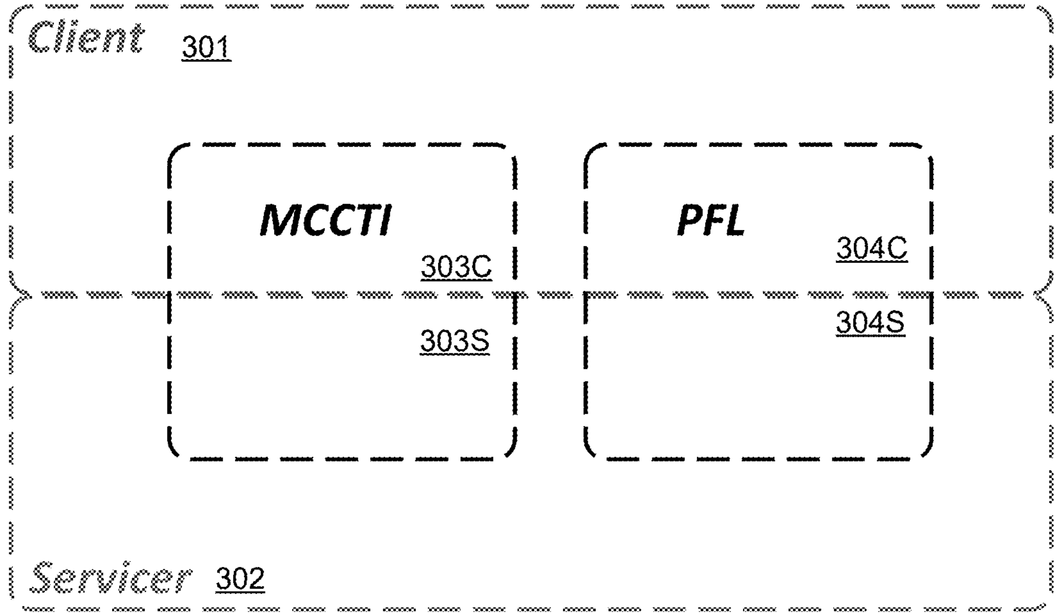
FIG. 3 depicts a block diagram of a separable/rejoinable spacecraft docking interface including a MCCTI according to an embodiment.

FIG. 3 depicts a block diagram of a separable/rejoinable spacecraft docking interface including a MCCTI according to an embodiment.

Specifically, FIG. 3 depicts a separable/rejoinable spacecraft docking interface 300 for connecting at least heat transfer mechanisms between a client 301 and servicer 302, the heat transfer mechanisms comprising a MCCTI having one or more client portions 303C and corresponding servicer portions 303S, and at least one pumped fluid loop (PFL) having a client portion 304C and a servicer portion 304S. The MCCTI 303C/303S may be formed as described above with respect to FIGS. 1-2 and accompanying text (i.e., serial, parallel, serial-parallel, etc.). The PFL 304C/304S may be formed in a standard manner and may achieve coupling independent from the MCCTI 303C/303S or as part of the MCCTI 303C/303S. That is, PFL 304C/304S interfacing may be achieved via the same electromagnetic coupling mechanism used to achieve MCCTI 303C/303S interfacing. Further, more than one MCCTI and/or PFL may be used.

The above-described MCCTI embodiments are relatively insensitive to space environments that would make ground testing difficult (such as microgravity or vacuum), thereby enabling high fidelity ground testing.

Typical spacecraft testing includes two separate tests: a docking test (which accurately measures the physical motion of the docking process) and a thermal performance test (which accurately measures the thermal conductance of the generated interface). It is difficult to run a single test that can properly measure both physical motion and thermal performance (need to distinguish between thermal contact made in the docking test and thermal contact made at the start of the thermal test).

Ground tests of the docking process should use standard gravity offload techniques (known to those skilled in the art) to enable the two spacecraft (or the two sides of the MCCTI mounted on surrogate spacecraft simulators) to simulate the docking process.

Ground tests of thermal performance may be comprise generating a known amount of heat on one side (e.g., the client side) and determining temperature differences as the heat is conducted to the other side (e.g., the servicer side). Efforts to minimize and manage heat leaks (familiar to those skilled in the art) should be incorporated to insure that a quality test is achieved. This data can then be used to calculate on-orbit performance under given thermal situations. Repeated tests should be done during qualification to insure repeatability. Provided that thermal performance variation from one docking event to the next is low and within the specified performance range of that MCCTI design, then acceptance tests of individual MCCTI units can be done with only a single or a few docking simulations.

Note that MCCTI would likely be incorporated as part of a larger docking system that might involve transfer of electrical power, fuel, information, and other resources. In this case MCCTI would be incorporated into a larger docking mechanism, involving other intellectual property owned by different owners.

The above-described MCCTI embodiments do not require any special provisions for ground storage or launch. Normal spacecraft operations for these events are acceptable to MCCTI. Within the context of a docking process, the MCCTI may be operated according to various procedures, such as the following:

Step 1: the two spacecraft rendezvous and orient themselves to face the docking mechanisms to one another.

Step 2: either the servicer or client side is designated as the 'active party'—the active party is the spacecraft that makes translational movements to bring the vehicles into contact.

Step 3: the side containing the EPM (nominally the servicer side) activates the EPM to create an electromagnetic field to draw in the FT.

Step 4: the active side maneuvers to close the gap between the two spacecraft.

Step 5: the closing speed at initial approach may be higher than at terminal approach.

Step 6: the active spacecraft may require deceleration relative to the passive party at the transition from initial to terminal approach.

Step 7: terminal approach is defined as during and immediately prior to the timeframe where the magnetic forces between the EPM-FT pair become significant and cause acceleration of the two spacecraft.

Step 8: the two spacecraft contact and are docked, there is no distinction between 'soft dock' and 'hard dock' as in traditional spacecraft docking schemes.

It is noted that this docking process is notional and subject to review and modification, especially in the case where MCCTI is incorporated as part of a docking mechanism with other capabilities.

Once the spacecraft is docked, the thermal conductance performance capability of the MCCTI is immediate. If there is a need to regulate the flow of heat across the MCCTI, this can be accommodated by features such as variable conductance heat pipes (VCHPs).

A calculation of the achievable performance of a PMCCTI found 50 W/K/kg mass-specific thermal conductance. "50 W/K/k" means that the PMCCTI with a mass of 1 kg can move 50 W of heat with only a 1 Kelvin temperature drop. A temperature drop of 5 Kelvin (i.e. 5 C) is more likely in a practical application, meaning that 250 W could be moved with a PMCCTI weighing 1 kg. This is quite a substantial amount. 250 W of heat is larger than the total thermal load of many small satellites and experiments, it is also a sizable fraction of the heat generation on medium and large satellites. Overall, this value of 50 W/K/kg provides a realistic, achievable, and useful value proposition to spacecraft requiring heat transfer across a docked interface.

While the invention has been described with reference to exemplary embodiments, it will be understood by those skilled in the art that various changes may be made and equivalents may be substituted for elements thereof without departing from the scope of the invention. In addition, many modifications may be made to adapt a particular system, device, or component thereof to the teachings of the invention without departing from the essential scope thereof. Therefore, it is intended that the invention not be limited to the particular embodiments disclosed for carrying out this invention, but that the invention will include all embodiments falling within the scope of the appended claims. Moreover, the use of the terms first, second, etc. do not denote any order or importance, but rather the terms first, second, etc. are used to distinguish one element from another.

In the preceding detailed description of exemplary embodiments of the invention, specific exemplary embodiments in which the invention may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present invention. It is also to be understood that other embodiments may be utilized, and that logical, architectural, programmatic, mechanical, electrical, and other changes may be made without departing from general scope of the invention. The following detailed description is, therefore, not to be taken in a limiting sense, and the scope of the present invention is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present invention. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that term is utilized.

What is claimed is:

1. Apparatus to transport heat between separable/rejoinable spacecraft from a client to a servicer when docked, comprising:

a Magnetically Coupled Conductive Thermal Interface (MCCTI) for transferring heat from a client to a servicer, the MCCTI comprising:

a client portion configured to couple heat from a client thermal control system (TCS) toward a client thermal interface, and a first portion of an electromagnetic coupling mechanism configured to urge the client thermal interface toward a corresponding servicer thermal interface when activated;

a servicer portion configured to couple heat from a servicer thermal interface toward a servicer TCS, and a second portion of the electromagnetic coupling mechanism configured to urge the servicer thermal interface toward a corresponding client thermal interface when activated;

the first and second portions of the electromagnetic coupling mechanism being positioned to magnetically cooperate with each other;

wherein the electromagnetic coupling mechanism comprises a ferrous target (FT) portion and an electropermanent magnet (EPM) portion.

2. The apparatus of claim 1, wherein:

the client portion comprises at least one heat pipe (HP) configured to couple heat from the TCS toward the client thermal interface; and the servicer portion comprises at least one HP configured to couple heat from the servicer thermal interface toward the servicer TCS.

3. The apparatus of claim 2, wherein the client portion further comprises a plurality of oscillating heat pipes (OHPs) configured to couple heat from the at least one client HP toward the client thermal interface.

4. The apparatus of claim 2, wherein the servicer portion further comprises a plurality of oscillating heat pipes (OHPs) configured to couple heat from the servicer thermal interface toward the at least one servicer HPs.

5. The apparatus of claim 2, wherein the servicer portion further comprises a plurality of oscillating heat pipes (OHPs) configured to couple heat from the servicer thermal interface toward the at least one servicer HP.

6. The apparatus of claim 2, wherein at least some of the HPs comprise constant conductance heat pipes (CCHPs).

7. The apparatus of claim 2, wherein at least some of the HPs comprise variable conductance heat pipes (VCHPs).

8. The apparatus of claim 1, wherein:

the MCCTI has associated with it a central region and a peripheral region;

the client thermal interface and corresponding servicer thermal interface being positioned within both the central and peripheral regions of the MCCTI; and the first and second portions of the electromagnetic coupling mechanism being positioned within the central region of the MCCTI.

9. The apparatus of claim 1, wherein:

the MCCTI has associated with it a central region and a peripheral region;

the client thermal interface and corresponding servicer thermal interface being positioned within the central region of the MCCTI;

the first portion of the electromagnetic coupling mechanism comprising at least two first portions of the electromagnetic coupling mechanism positioned at respective locations within the peripheral region of the MCCTI; and the second portion of the electromagnetic coupling mechanism comprising at least two second portions of the electromagnetic coupling mechanism positioned at respective locations within the peripheral region of the MCCTI.

10. The apparatus of claim 9, wherein each of the first and second portions of the electromagnetic coupling mechanism comprise two respective portions disposed on opposite sides of the peripheral region of the MCCTI.

11. The apparatus of claim 9, wherein each of the first and second portions of the electromagnetic coupling mechanism comprise three respective portions disposed equidistant from each other about the peripheral region of the MCCTI.

12. The apparatus of claim 1, wherein at least one of the client thermal interface and servicer thermal interface has disposed thereon a thermal interface material (TIM) configured to enable heat transfer between the client thermal interface and servicer thermal interface.

13. A spacecraft docking interface including a Magnetically Coupled Conductive Thermal Interface (MCCTI) for transferring heat from a client to a servicer, the MCCTI comprising:

a client portion configured to couple heat from a client thermal control system (TCS) toward a client thermal interface, and a first portion of an electromagnetic coupling mechanism configured to urge the client thermal interface toward a corresponding servicer thermal interface when activated;

a servicer portion configured to couple heat from a servicer thermal interface toward a servicer TCS, and a second portion of the electromagnetic coupling mechanism configured to urge the servicer thermal interface toward a corresponding client thermal interface when activated;

the first and second portions of the electromagnetic coupling mechanism being positioned to magnetically cooperate with each other;

wherein the electromagnetic coupling mechanism comprises a ferrous target (FT) portion and an electropermanent magnet (EPM) portion.

14. The spacecraft docking interface of claim 13, wherein:

the client portion comprises at least one heat pipe (HP) configured to couple heat from the TCS toward the client thermal interface; and the servicer portion comprises at least one HP configured to couple heat from the servicer thermal interface toward the servicer TCS.

15. The spacecraft docking interface of claim 14, wherein the client portion comprises at least one pumped fluid loop (PFL) configured to couple heat from the TCS toward the client thermal interface.

16. The spacecraft docking interface of claim 14, further comprising at least one of a pumped fluid loop (PFL), loop heat pipe (LHP), and capillary pumped loop (CPL).

17. The spacecraft docking interface of claim 14, wherein:

the client portion further comprises a plurality of oscillating heat pipes (OHPs) configured to couple heat from the client HPs toward the client thermal interface; and the servicer portion further comprises a plurality of OHPs configured to couple heat from the servicer thermal interface toward the servicer HPs.

18. The spacecraft docking interface of claim 14, wherein at least some of the HPs comprise constant conductance heat pipes (CCHPs).

19. The spacecraft docking interface of claim 14, wherein at least some of the HPs comprise variable conductance heat pipes (VCHPs).

20. The spacecraft docking interface of claim 13, wherein:

the MCCTI has associated with it a central region and a peripheral region;

the client thermal interface and corresponding servicer thermal interface being positioned within both the central and peripheral regions of the MCCTI; and the first and second portions of the electromagnetic coupling mechanism being positioned within the central region of the MCCTI.

21. The spacecraft docking interface of claim 13, wherein:

the MCCTI has associated with it a central region and a peripheral region;

the client thermal interface and corresponding servicer thermal interface being positioned within the central region of the MCCTI;

the first portion of the electromagnetic coupling mechanism comprising at least two first portions of the electromagnetic coupling mechanism positioned at respective locations within the peripheral region of the MCCTI; and the second portion of the electromagnetic coupling mechanism comprising at least two second portions of the electromagnetic coupling mechanism positioned at respective locations within the peripheral region of the MCCTI.

22. The spacecraft docking interface of claim 20, wherein:

each of the first and second portions of the electromagnetic coupling mechanism comprise two respective portions disposed on opposite sides of the peripheral region of the MCCTI.

* * * * *